United States Patent [19]

Arlt et al.

[11] Patent Number: 4,804,641
[45] Date of Patent: Feb. 14, 1989

[54] METHOD FOR LIMITING CHIPPAGE WHEN SAWING A SEMICONDUCTOR WAFER

[75] Inventors: Manfred Arlt, Regensburg; Joachim Dathe, Munich, both of Fed. Rep. of Germany

[73] Assignee: Siemens Aktiengesellschaft, Berlin and Munich, Fed. Rep. of Germany

[21] Appl. No.: 905,663

[22] Filed: Sep. 11, 1986

[30] Foreign Application Priority Data

Sep. 30, 1985 [DE] Fed. Rep. of Germany ....... 3534894

[51] Int. Cl.⁴ .......................................... H01L 21/302
[52] U.S. Cl. .................................... 437/227; 437/205; 437/226; 148/DIG. 28
[58] Field of Search ................. 427/82; 148/DIG. 28; 437/205, 226, 227

[56] References Cited

U.S. PATENT DOCUMENTS

| | | | |
|---|---|---|---|
| 3,620,827 | 11/1971 | Conet | 427/82 |
| 3,974,003 | 8/1976 | Zirinsky | 427/82 |
| 4,033,027 | 7/1977 | Fair et al. | 437/226 |
| 4,096,619 | 6/1978 | Cook | 437/226 |
| 4,217,689 | 8/1980 | Fujii | 148/DIG. 28 |
| 4,267,205 | 5/1981 | Pastor | 427/82 |
| 4,495,219 | 1/1985 | Kato | 427/82 |
| 4,606,935 | 8/1986 | Blum | 427/82 |

FOREIGN PATENT DOCUMENTS

| | | | |
|---|---|---|---|
| 0032801 | 7/1981 | European Pat. Off. | 148/DIG. 28 |
| 1480433 | 12/1967 | France | |
| 2382097 | 9/1978 | France | |
| 48-02836 | 1/1973 | Japan | 427/82 |
| 26421 | 8/1973 | Japan | 437/227 |
| 0071950 | 6/1981 | Japan | 427/82 |
| 1118536 | 7/1968 | United Kingdom | |

*Primary Examiner*—Shrive Beck
*Assistant Examiner*—Vi Duong Dang

[57] ABSTRACT

A method for limiting chippage when sawing a semiconductor wafer into individual pieces which involves providing a dielectric layer at least in some portions of the wafer surface. A border of the dielectric layer is applied to the margins of the individual parts which are to be formed on the surface of the semiconductor wafer, being applied under such conditions that the margins exert a tensile stress on the semiconductor surface. This produces a symmetrical tensile stress distribution for limiting the chippage of the semiconductor material in the sawing region on the surface of the semiconductor wafer.

7 Claims, 1 Drawing Sheet

METHOD FOR LIMITING CHIPPAGE WHEN SAWING A SEMICONDUCTOR WAFER

BACKGROUND OF THE INVENTION

1. Field of the Invention

The present invention is in the field of semiconductor wafers, and provides a method for preparing such a wafer for sawing to limit chippage.

2. Description of the Prior Art

When semiconductor wafers are severed into individual chips by sawing, chippage referred to as mussel chippages occur at the saw edge of the front side of the semiconductor wafer. These mussel chippages arise independently of the sawing depth with respect to the semiconductor wafer and their extent depends on various sawing parameters such as the quality of the saw blade, the age of the saw blade, the sawing rate, and the like. The chippage is also dependent upon the parameters of the semiconductor wafers such as, for example, the doping of the semiconductor in the sawing region, the type and number of surface layers, and similar factors.

The flat splinterings of semiconductors referred to as chippage can influence the component quality when the chippage width is so high that active chip regions such, for example, as a guard ring or a pn-junction are destroyed.

Previous efforts have been made to avoid the reduction in quality of the individual chips by providing correspondingly large spacing between the active regions of an individual chip and the region destroyed by the chippage at its maximum point. No crystal destruction with respect to individual chips based on invisible "micro-cracks" can be determined outside of the visible fracture zone in the region of the chippage by means of an anisotropic etching such as a so-called "Sirtl-etch".

In the miniaturization of semiconductor components, it is important to save space and therefore the space on the surface of a semiconductor wafer should be utilized to the fullest extent. Consequently, the present invention seeks to reduce the width of the sawing track without reducing the quality or the yield of the individual chips obtained from a semiconductor wafer by sawing.

In accordance with the present invention, there is provided a method for preparing a semiconductor wafer for sawing to limit chippage upon sawing into individual pieces which involves applying a dielectric layer at least on portions of the wafer in the form of a border on the margins of those portions which are to form individual parts, the dielectric layer being applied under conditions such that the border exerts a tensile stress on the semiconductor surface, the border providing a symmetrical tensile stress distribution for limiting the chippage of the semiconductor material during sawing.

The advantages of the invention shall be set forth in a succeeding portion of the Specification with reference to silicon and silicon compounds. The invention, however, is not limited to employing silicon semiconductor wafers or to silicon compounds. On the contrary, any semiconductor wafer in combination with chemical silicon compounds or in combination with dielectric layers can be handled with the method of the present invention.

SUMMARY OF THE INVENTION

In the present invention, the mechanical stresses which, for example, arise during the thermal oxidation of silicon in the region of the boundary surface between silicon and silicon dioxide are exploited in order to prevent the chippage of the silicon when sawing a semiconductor wafer. After cooling from the oxidation temperature to room temperature through a defined temperature differential, the thermal silicon dioxide grown on the silicon surface is under considerable compressive stress and the silicon in proximity of the boundary surface to the silicon dioxide is under tensile stress. The stress is caused by the different linear coefficients of thermal expansion of silicon and silicon dioxide. Silicon has a linear coefficient of expansion of $2.5 \times 10^{-6}/°C$. The linear coefficient of expansion of silicon dioxide amounts to $0.5 \times 10^{-6}/°C$.

The forces in the silicon increase as the temperature differential between the oxidation temperature and the room temperature increases, and as the thickness of the silicon dioxide increases. When the tensile force which the silicon dioxide exerts on the silicon at the boundary surface to the silicon exceeds a critical value, there is a stress compensation in the form of flat crystal dislocations occurring in the silicon. These flat crystal dislocations are referred to as "saucer etch pits".

The present invention may employ, for example, an oxide wherein this stress compenation has not occurred in the silicon at the boundary surface to the silicon. When a border surrounding the active region of a semiconductor component single chip is etched from the oxide applied to the semiconductor surface, the border having a width on the order of magnitude of 1 micron and preferably a width equal to or greater than 5 microns, and having an oxide thickness on the order of magnitude of 0.5 micron, preferably greater than or equal to 0.1 micron, then the symmetrical tensile stress distribution arising in proximity to the oxide edges of the border surrounding the active region at the silicon surface in the sawing region between two individual chips prevents chippage of the silicon.

BRIEF DESCRIPTION OF THE DRAWINGS

Further features and advantages of the present invention will be described in conjunction with the attached drawings, in which.

DESCRIPTION OF THE PREFERRED EMBODIMENTS

Figure 1:
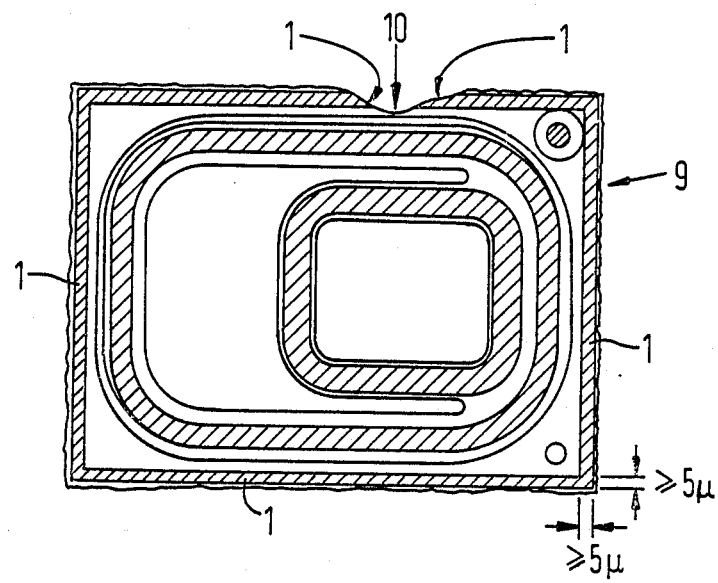
FIG. 1 illustrates a plan view partly in cross section of a single chip employing a border according to the present invention.

FIG. 1 illustrates a plan view of a sawn single chip representing an npn transistor. The collector-base diode comprises a border 1 of silicon dioxide which has been applied to a silicon substrate 5 at elevated temperatures. As shown in FIG. 1, chippages 9 are stopped at the oxide edge of the border 1, since the pressure forces which arise when sawing the semiconductor wafer and which, when they exceed a critical value, lead to mechanical crystal destruction are compensated for by the tensile forces of the thermal oxide of the border 1.

FIG. 1 also shows that with excessively high sawing forces as shown in the region 10, the compensation of the pressure forces arising during sawing by the tensile forces of the thermal oxide may be inadequate and a large chippage may arise. Such high sawing forces, however, do not occur under normal sawing conditions and occur only with a non-suitable saw adjustment or with a poorly dressed saw blade.

Due to the presence of the chippage stopper border 1, the width of the saw track in the sawing region 7 can be reduced in size without reducing the quality or the yield of individual semiconductor components. In this way, costly space on the semiconductor wafer can be saved and more semiconductor components can be manufactured per semiconductor wafer as a result.

Figure 2:
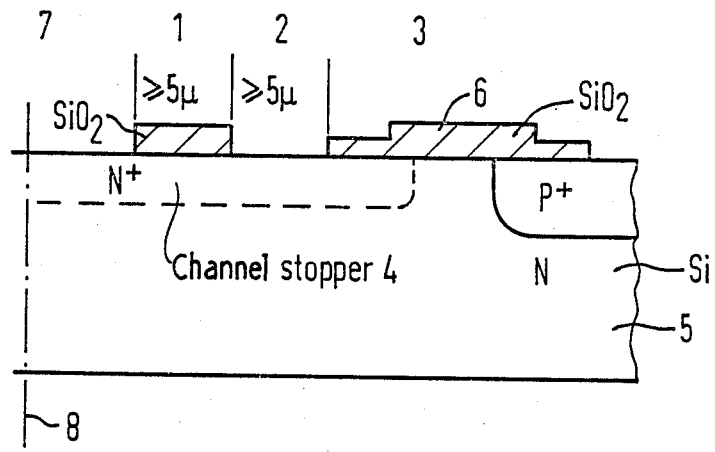
FIG. 2 is a schematic cross-sectional view through an embodiment of the present invention which uses the improved border.

FIG. 2 illustrates schematically a cross section through a p+n diode of FIG. 1. In the n-doped silicon substrate 5 there are a p+-doped zone for achieving a p+n junction for the diode and an n+ channel stopper 4. The diode shown in FIG. 2 comprises a chippage stopper border 1 of silicon dioxide having a width greater than or equal to 5 microns, comprising a safety region 2 between the chippage stoppage border 1 and the active region 3 of the diode. The safety region 2 also preferably comprises a width of greater than or equal to 5 microns. In the active region 3, the transitions between the variously doped zones are covered by a silicon dioxide layer 6. The safety region 2 improves the protection of the active region 3 against injurious influences.

The chippage stopper border 1 on the semiconductor substrate 5 is only effective when a symmetrical tensile stress distribution arises in the middle 8 of the sawing region 7 between two individual semiconductor component chips, particularly in the sawing region 7 in proximity to the edges of the chippage stopper border 1 of the neighboring individual semiconductor component chips at the surface of the semiconductor substrate 5. This symmetrical tensile stress distribution in the middle 8 of the sawing region 7 arises, for example, because the chippage stopper border is applied to the semiconductor substrate 5 in a special way. It should be noted that the chippage stopper border 1 need not be composed of a thermal oxide. It can be composed of a chemically vapor deposited oxide or it may be a nitride layer when the deposition parameters are so selected that a symmetrical tensile stress distribution arises in the sawing region 7, thus compensating the pressure forces arising during sawing. For this purpose, for example, a chippage stopper border 1 can be applied at elevated temperatures and can be cooled suddenly during the application of the dielectric layer. When the linear coefficient of expansion of the chippage stopper border is greater than the linear coefficient of expansion of the semiconductor substrate, the chippage stopper border can also be applied to the semiconductor substrate at a reduced temperature. The chippage stopper border can also be applied at normal temperatures when the sawing, for example, occurs at lower or at even a higher temperature depending upon the relationship of the coefficients of expansion. What is important for the invention is that there is a difference in the linear coefficients of expansion of the semiconductor substrate and the chippage stopper border 1 which is exploited to the effect that a symmetrical tensile stress distribution arises in the sawing region 7 due to variations in temperature and physical or chemical occurrences in the semiconductor crystal.

The chippage stopper border 1 can be integrated into the structuring of semiconductor components including, of course, integrated circuits. For example, further layers such as phosphorous silicate glass, nitrides, aluminum, and the like, can be applied over the chippage stopper border. These further layers have no influence on the functioning of the border itself.

The border 1 need not completely surround the edge of a later-formed individual part of the semiconductor wafer. In order to achieve a symmetrical tensile stress in the sawing region 7, it will suffice for the border 1 to be present only in sections at the edge of a later-formed individual part of the semiconductor wafer. What is important is that the chippage stopper border 1 is applied to the semiconductor wafer at a temperature which differs from the temperature at which the semiconductor wafer is sawed.

It will be evident that various modifications can be made to the described embodiments without departing from the scope of the present invention.

We claim as our invention:

1. A method for preparing a semiconductor wafer for sawing to limit chippage upon sawing it into individual pieces which comprises:
    applying a dielectric layer in limited portions of said wafer in the form of a border spaced from margins of those portions which are to form individual parts, and spaced from the sawing line to be employed,
    said dielectric layer being applied under conditions such that said border is under compressive stress and exerts a tensile stress on the semiconductor surface said border providing a symmetrical tensile stress distribution for limiting the chippage of the semiconductor material during sawing.

2. A method according to claim 1 in which said dielectric layer is applied by thermal oxidation of the wafer surface to produce a dielectric oxide.

3. A method according to claim 1 wherein said dielectric layer is applied by depositing an oxide layer on said wafer surface.

4. A method according to claim 1 wherein said dielectric layer is applied by depositing a nitride layer on said wafer surface.

5. A method according to claim 1 wherein said dielectric layer is applied at an elevated temperature.

6. A method according to claim 1 wherein said semiconductor wafer is suddenly cooled during application of said dielectric layer.

7. A method according to claim.1 wherein said border has a width on the order of 1 micron and a thickness on the order of 0.1 micron.

* * * * *